(12) United States Patent
Fazio et al.

(10) Patent No.: US 6,573,152 B1
(45) Date of Patent: Jun. 3, 2003

(54) SELF-PLANARIZING PROCESS FOR SHALLOW TRENCH ISOLATION

(75) Inventors: Barbara Fazio, Messina (IT); Giuliana Curro, Torre Faro (IT); Nicola Nastasi, Milazzo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/687,213

(22) Filed: Oct. 12, 2000

Related U.S. Application Data
(60) Provisional application No. 60/159,132, filed on Oct. 12, 1999.

(51) Int. Cl.$^7$ .............................................. H01L 21/76
(52) U.S. Cl. ....................................... 438/424; 257/510
(58) Field of Search .......................... 257/510; 438/424, 438/789

(56) References Cited

U.S. PATENT DOCUMENTS

| | | | |
|---|---|---|---|
| 5,872,058 A | 2/1999 | Van Cleemput et al. ..... | 438/692 |
| 5,913,140 A | 6/1999 | Roche et al. ................ | 538/624 |
| 5,915,190 A | 6/1999 | Pirkle .......................... | 438/424 |
| 5,920,792 A | 7/1999 | Lin .............................. | 438/633 |
| 6,191,004 B1 * | 2/2001 | Hsiao .......................... | 438/435 |
| 6,261,957 B1 * | 7/2001 | Jang et al. ................... | 438/692 |
| 6,331,472 B1 * | 12/2001 | Liu et al. ..................... | 438/424 |

FOREIGN PATENT DOCUMENTS

| | | | |
|---|---|---|---|
| EP | 813240 A1 | 12/1997 | |
| TW | 0110294 | * 6/1999 | |
| WO | WO 99/47728 | 9/1999 | |

OTHER PUBLICATIONS

Van Cleemput et al., HDPCVD Films Enabling Shallow Trench Isolation, Semiconductor Intl., Jul. 1997, pp. 197–186.*

Nag, S. et al., "Shallow Trench Isolation For sub–0.25–$\mu$m IC Technologies," Solid State Technology, 40(9): 129–130, 132,134, 1994.

* cited by examiner

Primary Examiner—Michael S. Lebentritt
Assistant Examiner—Christian D. Wilson
(74) Attorney, Agent, or Firm—Lisa K. Jorgenson; Dennis M. de Guzman; Seed IP Law Group PLLC (57) ABSTRACT

Described is a method to form isolation structures on a semiconductor substrate. This method begins with forming one or more trenches in the semiconductor substrate and depositing a first portion of a dielectric layer at a first rate by a High Density Plasma—Chemical Vapor Deposition into the trenches and onto the semiconductor substrate. This first deposition at least partially fills the trenches and may completely fill the trenches. Next, a second portion of the dielectric layer is deposited at a second rate by the High Density Plasma—Chemical Vapor Deposition over the semiconductor substrate to partially planarize the dielectric layer. This second deposition is preferably performed with a different flow rate of reaction gasses than the first deposition. Finally, a portion of the dielectric layer that was deposited at the second rate is removed by a CMP process, for example.

20 Claims, 11 Drawing Sheets

SELF-PLANARIZING PROCESS FOR SHALLOW TRENCH ISOLATION

This application claims the benefit of Provisional Application No. 60/159,132 filed Oct. 12, 1999.

TECHNICAL FIELD

This invention relates to shallow trench isolation, and more particularly to a process for forming shallow trenching isolations and the isolated shallow trenches formed thereby.

BACKGROUND OF THE INVENTION

Shallow trench isolation (STI) is a process for isolating active areas in integrated microelectronic devices. An advantage of using the STI technique rather than the popular local oxidation of silicon (LOCOS) technique is that the latter leaves "field beak" or "bird beak" areas in edges of the insulating dielectric. These areas are generally unusable areas of the integrated circuit and they therefore increase wasted area of the chip. Using the STI technique leaves behind no such artifacts. This advantage of using STI results in a more positive definition of the active areas and therefore reduces overall circuit dimensions.

However, using STI is generally a more complex process than using LOCOS, and therefore generally adds more steps and cost to the process. Defining the isolation regions using STI can be summarized by three major steps, each comprising a more or less extended series of operation and processes.

Figure 1:
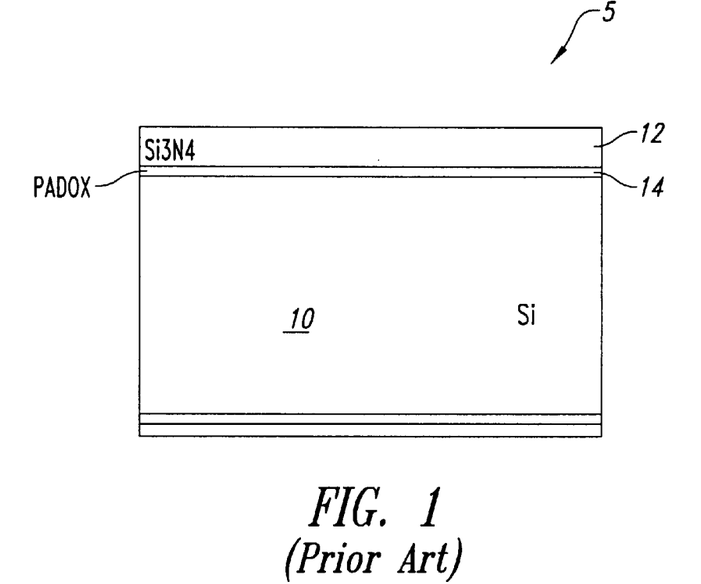
FIGS. 1–10 are cross-sectional views of a wafer showing some of the process steps necessary for creating a shallow trench isolation using methods of the prior art.
Figure 2:
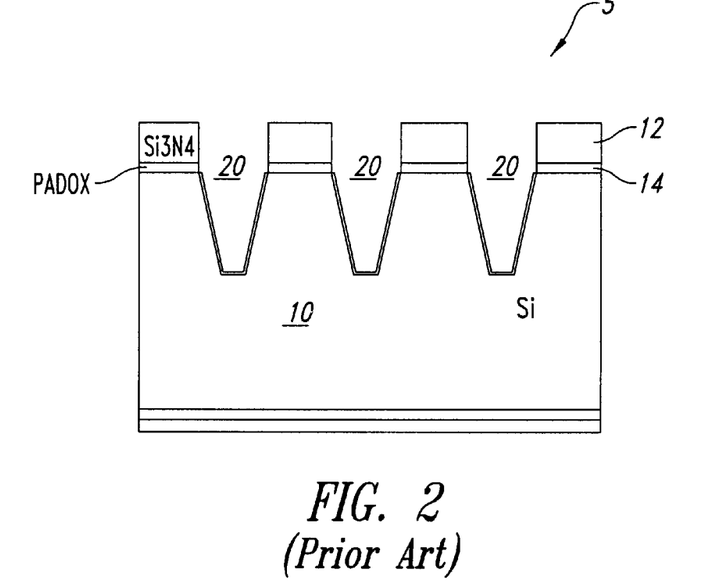

First, a trench is defined in the silicon substrate. As shown in FIG. 1, a starting wafer 5 generally includes a silicon nitride layer 12 and a silicon substrate 10. The nitride layer 12 can be made from $Si_3N_4$ and deposited on the generally planar silicon substrate 10. An optional PADOX layer 14 is also shown between the substrate 10 and the nitride layer 12. As shown in FIG. 2, trenches 20 are defined in areas which will later be the isolation regions. The silicon substrate 10 is trenched down to a predetermined depth and with a predetermined slope in sidewalls of the trenches.

In the second major step, the trenches 20 are filled with a dielectric material. The trenches 20 thus defined in the silicon substrate 10 are then filled with a dielectric known as the field oxide. This field oxide is typically a silicon oxide. This step of the process is carried out as one or more separate depositions. The deposited dielectrics, if produced by separate depositions, would have different chemo-physical characteristics, and must be made uniform by a later thermal treatment known as densification.

Figure 3:
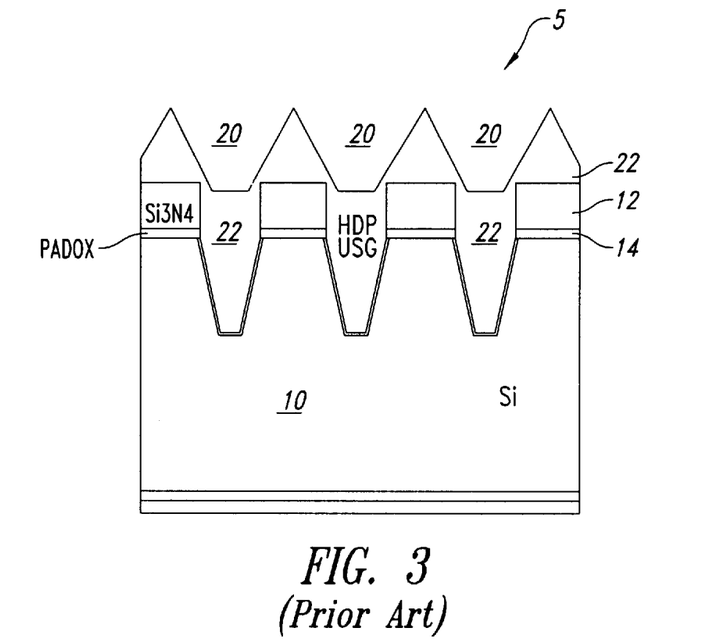
Figure 4:
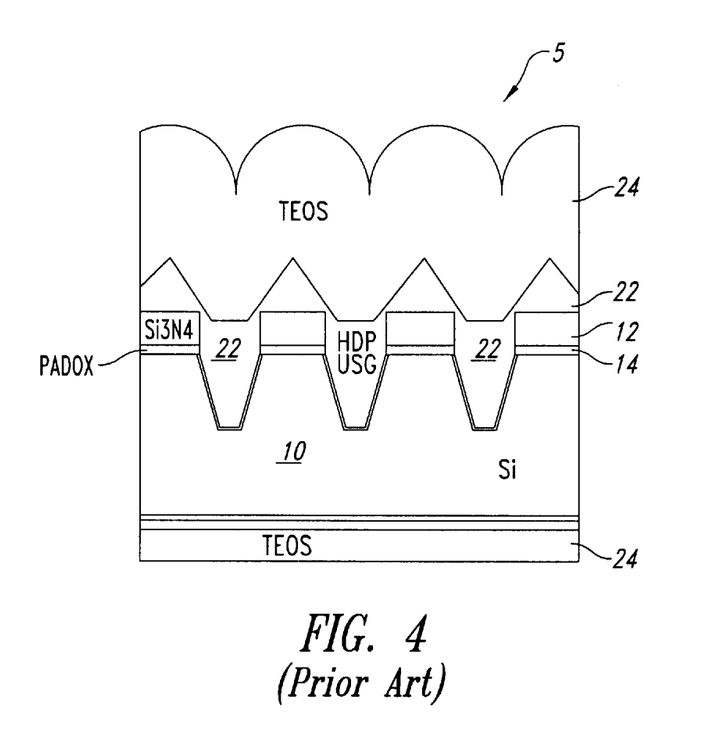

An example of trench 20 filling is shown in FIG. 3. In that Figure, a first dielectric layer 22 is deposited by HDPCVD into the trenches 20 and onto the other portions of the silicon substrate 10. The first dielectric layer 22 forms peaked areas over the portions of the silicon nitride layer 12 that remain after the trenches 20 were formed, and causes a generally uneven topology for the wafer 5. The first dielectric layer 22 must have excellent step coverage in order to completely fill the trenches 20. Partially or completely unfilled trenches are undesirable because they can interfere with operation of the later-formed circuit. However, filling the trenches with this first dielectric layer deposited by HDPCVD causes the wafer 5 to have a very uneven topology as shown in FIG. 3. This uneven topology makes it very difficult to later planarize the wafer 5, which is necessary for further circuit construction. Therefore, this first deposition is followed by a second deposition of a second dielectric layer 24, such as a TEOS layer formed by LPCVD as shown in FIG. 4. This TEOS layer 24 is more easily planarized than the first dielectric layer 22. However, it is impossible for the TEOS layer 24 to be used to fill the trenches 20 of the silicon substrate 10 because of the poor step coverage of the second dielectric layer 24, and the corresponding problems of partially filled trenches 20 described above. Note too that, during the deposition of the TEOS layer 24 above the first dielectric layer 22, a thin layer of the TEOS layer 24 is deposited on a backside of the wafer 5, which will later have to be removed. After the trenches 20 have been filled with the dielectric materials 22, 24, the silicon wafer 5 has an uneven topology.

The third major step in an STI process is that the silicon wafer 5 is planarized and active areas are defined. Active areas are first exposed by removing excess deposited dielectric layers 22, 24 so as to uncover the nitride structures made from the remaining portions of the nitride layer 12. In order to remove the excess deposited dielectric layers 22, 24 a Chemical Mechanical Polishing (CMP) technique is generally used. However, in order to utilize CMP, the wafer 5 must be changed from how it appears in FIG. 4. Primarily, portions of the TEOS layer 24 need to be removed where they correspond with peaks of the first dielectric layer 22. That will ensure a better planarity of the wafer 5 after the CMP step.

Figure 5:
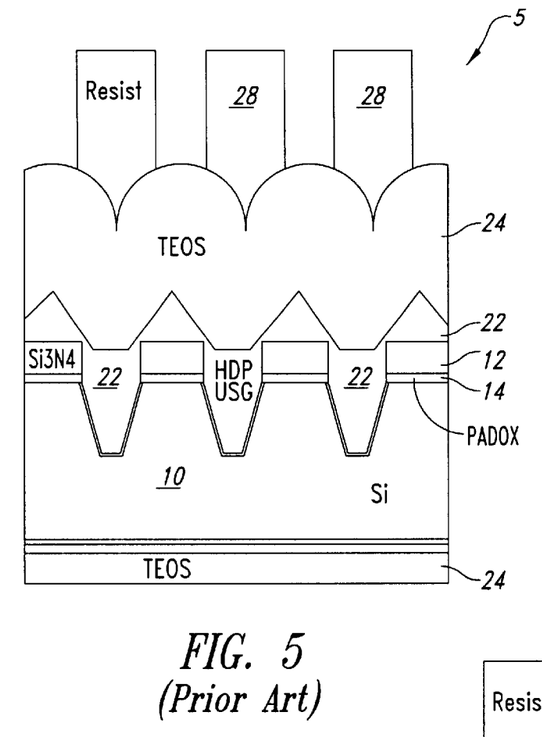
Figure 6:
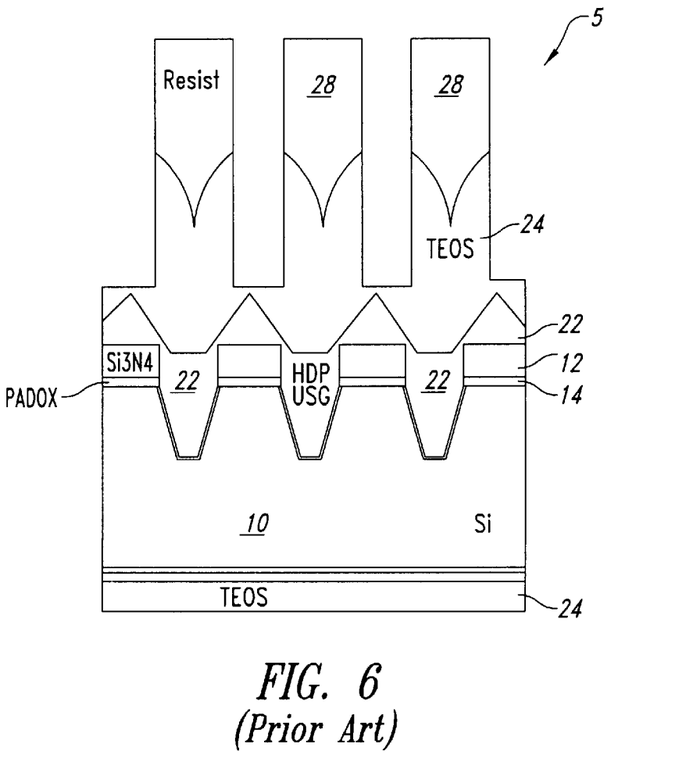

The beginning of the procedure preparing for the CMP step begins by a step of densification to make the two oxide films 22, 24 more homogeneous, and thus undistinguishable in the CMP process. Once the densification has been completed the procedure continues, shown in FIG. 5, with a mask 28 being deposited on the TEOS layer 24. This mask 28 is sometimes called a counter-mask because it is exactly opposite of the trenches 20 formed in FIG. 2. Once the mask 28 is completely formed, the TEOS layer 24 is etched down, in areas other than those covered by the mask 28, to a level nearly even with the top of the highest portions of the first dielectric layer 22. Forming the mask 28 and etching the TEOS layer 24 are shown in FIGS. 5 and 6, respectively.

Figure 7:
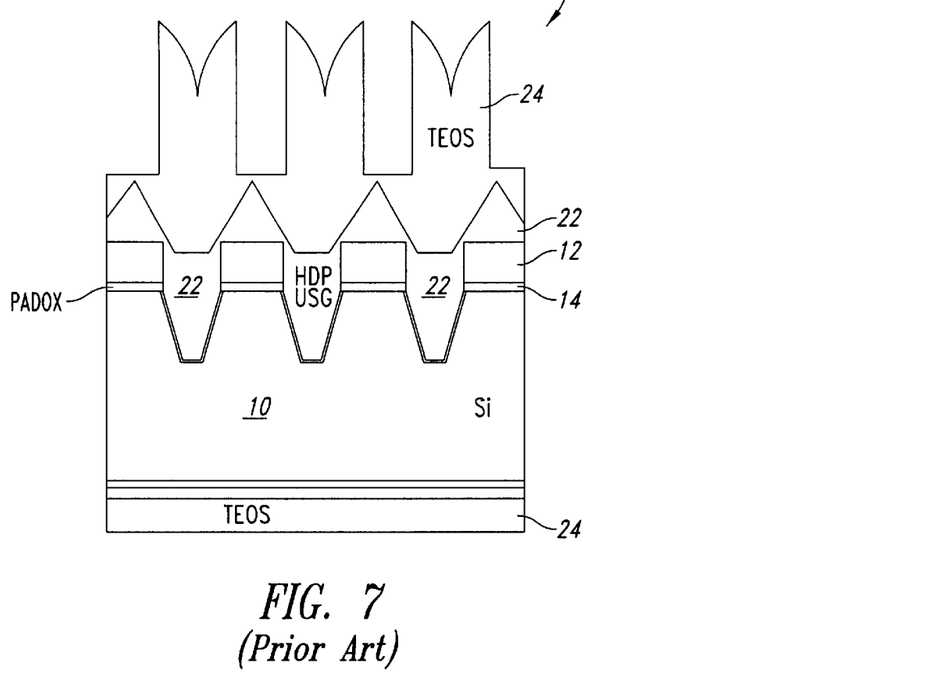

The mask 28 is then removed, as shown in FIG. 7. The remaining structure as it is shown in FIG. 7 is ready for the CMP step or steps. The definition of the shallow trench isolation of the wafer 5 is then completed by partially removing the nitride and optimizing the field height relative to the active areas. After the CMP and definition is complete, the finished structure will look like the one shown in FIG. 8.

Figure 9:
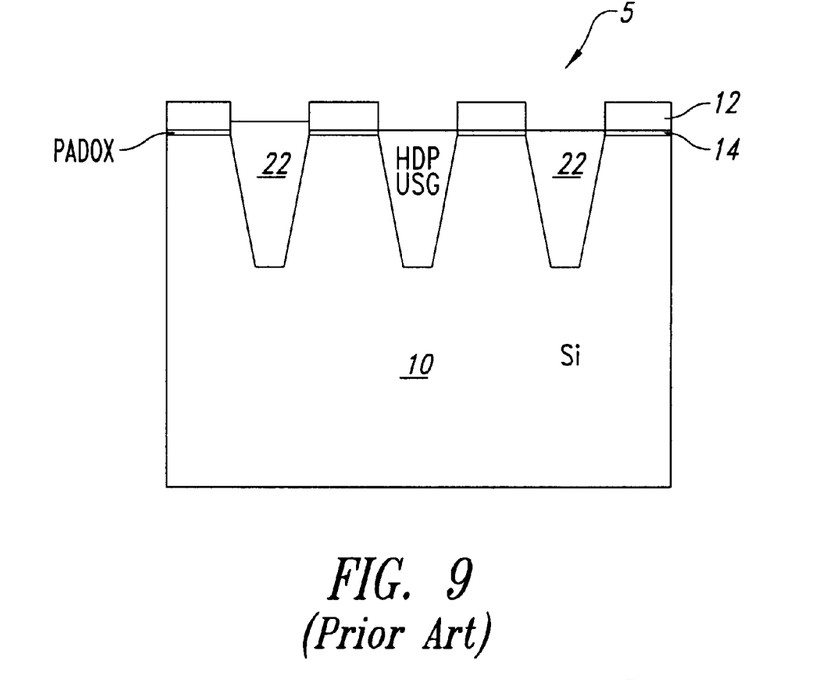
Figure 10:
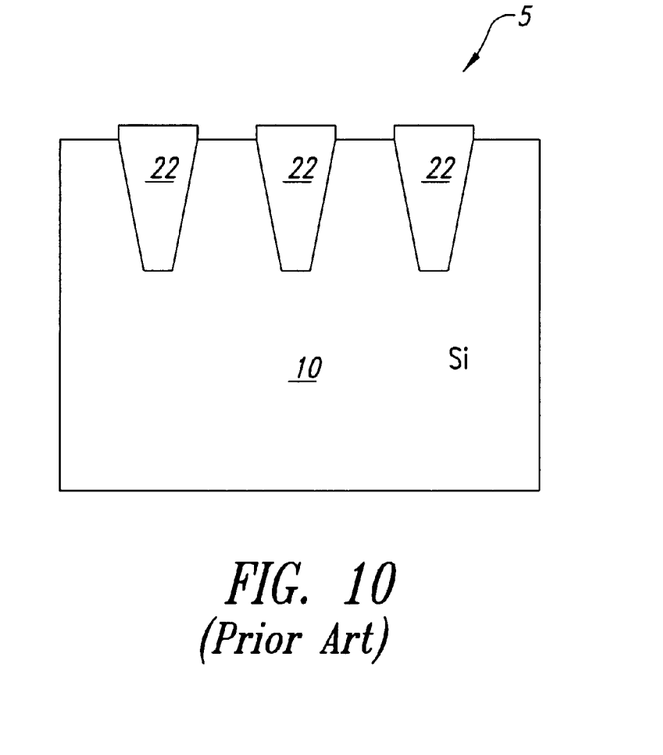

Following the CMP process, the TEOS layer 24 on the backside of the wafer is removed in a step shown in FIG. 9. Then, the depending on the desired processing, remaining nitride areas 12 and the optional PADOX layer 14 can be removed, leaving the completed STI structures as shown in FIG. 10.

The critical aspects of such a process scheme as described above are tied to their inherent nature as well as to the large number of the operations involved, which makes it an expensive process for forming isolation regions. Additionally, each step entails changing the fabrication setup, performing measurements, and increases chances for spoilage of the wafer 5.

Until now, there is no simple, inexpensive way to produce field oxide isolation regions using a shallow trench isolation technique that lessens the problems of the prior art.

SUMMARY OF THE INVENTION

The disclosed process uses a special application of HDPCVD which allows trenches in a silicon substrate to be filled and partially planarized in one step. Thus, presented is a simplified production flow used for implementing shallow trench isolation, whereby the number of the process steps substantially fewer than currently used in the prior art.

Embodiments of the invention provide a method to form isolation structures on a semiconductor substrate. This method begins with forming one or more trenches in the semiconductor substrate and depositing a first portion of a dielectric layer at a first rate by a High Density Plasma—Chemical Vapor Deposition into the trenches and onto the semiconductor substrate. This first deposition at least partially fills the trenches. Next, a second portion of the dielectric layer is deposited at a second rate by the High Density Plasma—Chemical Vapor Deposition over the semiconductor substrate to partially planarize the dielectric layer. This second deposition is preferably performed with a different flow rate of reaction gasses than the first deposition. Finally, a portion of the dielectric layer that was deposited at the second rate is removed.

DETAILED DESCRIPTION

Embodiments of this invention use a technique called High Density Plasma Chemical Vapor Deposition (HDPCVD), which allows an excellent quality dielectric, such as silicon oxide to be deposited on a substrate and in trenches formed in the substrate. Techniques using HDPCVD have been previously used to deposit isolation dielectric between metallization strips of circuit devices. This technique allows very narrow gaps to be precisely filled by carefully controlling two simultaneous and somewhat opposing processes: chemical deposition of a dielectric and simultaneous physical erosion of the dielectric being deposited.

Embodiments of this invention use this deposition method for a particular deposition of the dielectric used for a trench filling step and additionally for a planarization step, without the need for complex intermediary steps.

In a preferred embodiment, the gases used during the deposition are oxygen ($O_2$) and silane ($SiH_4$), which are reaction gases. Additionally, argon (Ar) ions are present in a plasma. These gasses, once suitably accelerated and orientated by a purposely provided frequency generator (Bias RF), enable physical erosion of a dielectric film to take place as it is being deposited. To ensure a good composition of the resulting dielectric film, processing under excess oxygen is important, and preferably, the ratio of $O_2$ to $SiH_4$ should be in the range of 2:1.

The deposition process applied utilizes the aforementioned simultaneous balance of dielectric deposition and physical erosion of the dielectric to provide an oxide film with excellent self-planarizing properties.

In the form preferred for making STI structures, two discrete portions of a process are successively run. In a first portion, roughly 4000 Å thick oxide film is deposited which can be used to fill structures. A second, more aggressive portion of the process is then performed wherein the partial planarization is accomplished by etching away the oxide at a faster rate than was used in the first portion.

The individual portions of the process differ from each other in the rate of flow of the reaction gases and, therefore, also by the chamber internal pressure. In this preferred embodiment, the flow rates of the reaction gasses in the second portion is less than one-half the flow rates in the first. Preferably, the ratios of the reaction gasses in the first and second portions of the process remain the same. However, although the ratios of such flows and the powers of the frequency generators are kept constant between the first and second portions of the process, a halved ratio of deposition component to etch component, with respect to the first portion, is achieved due to the increased flow of reaction gasses in the second portion.

Figure 11:
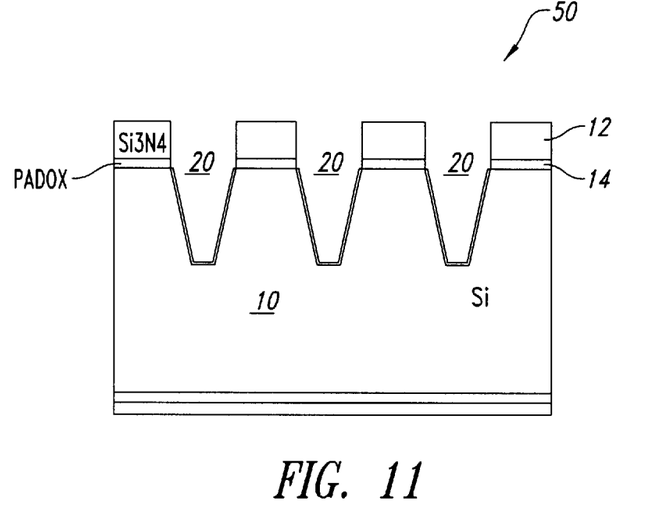
FIGS. 11–14 are cross sectional views of a wafer showing some of the process steps used to create a shallow trench isolation using methods according to aspects of the inventive process.

The HDPCVD process as disclosed and as applied to the process flow for creating STI structures is shown beginning in FIG. 11. In FIG. 11 is a wafer 50, which is identical to the wafer 5 as it appears in FIG. 2. In FIG. 11, the trenches 20 have been formed in the substrate 10 that is covered by the optional PADOX layer 14 and the nitride layer 12, just as they were formed in FIG. 2.

Figure 12:
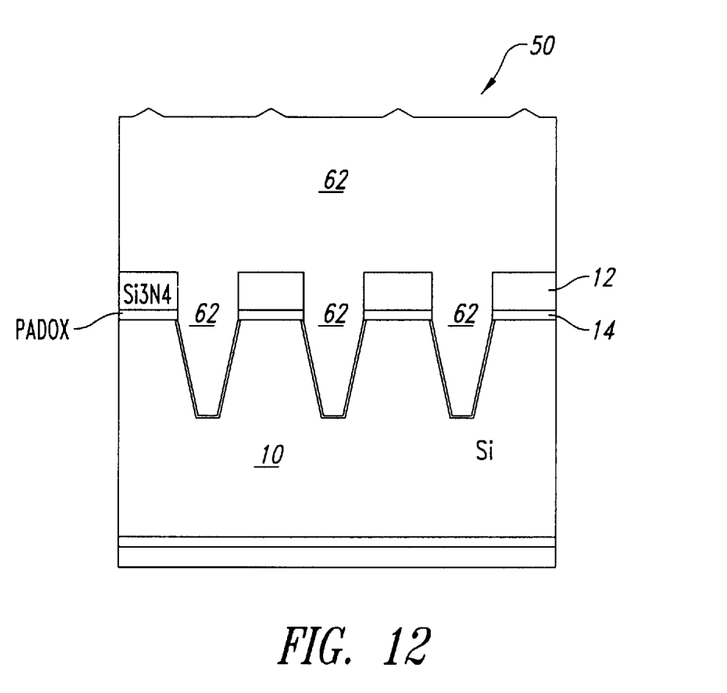

FIG. 12 shows the wafer 50 after it has undergone the first and second portions of the HDPCVD process, as described above. In the first portion of the process, a first amount of a first dielectric 62 was deposited on the semiconductor substrate 10. In this first portion, the etch rate of the first dielectric 62 was at a first level, as was determined from the flow rate of the reaction gasses. During the first portion of the process, preferably, the trenches 20 were filled to a level roughly equal with that of the nitride layer 12. However, the amount of first dielectric 62 that is deposited in this first portion could amount to any level that would ultimately fill the trenches 20 at the end of the complete process.

This first portion of the process, as described above, has a higher deposition rate than the second portion of the process. Therefore, at the end of the first portion of the process, the planarity of the wafer 50 would not be planar enough to enable a CMP polishing step directly.

After the first portion of the process is completed and the first amount of the first dielectric 62 is deposited, the second portion of the process is performed. In this second portion, the reaction gasses have an decreased flow rate, and will therefore etch the deposited dielectric at a faster rate than during the first portion of the process. It is preferable that the etch rate not be so high so that no dielectric is deposited, however. During this second portion, additional amounts of the first dielectric 62 are deposited to a level of that shown in FIG. 12.

It is especially noteworthy that the planarity of the first dielectric 62 in FIG. 12, after the first and second portions of the process have occurred, is such that a CMP step can be directly performed without any additional masking and etching as was necessary in the prior art. After the CMP step is performed on the wafer 50 as it was in FIG. 13, the resulting structure 50 is shown in FIG. 13.

Figure 8:
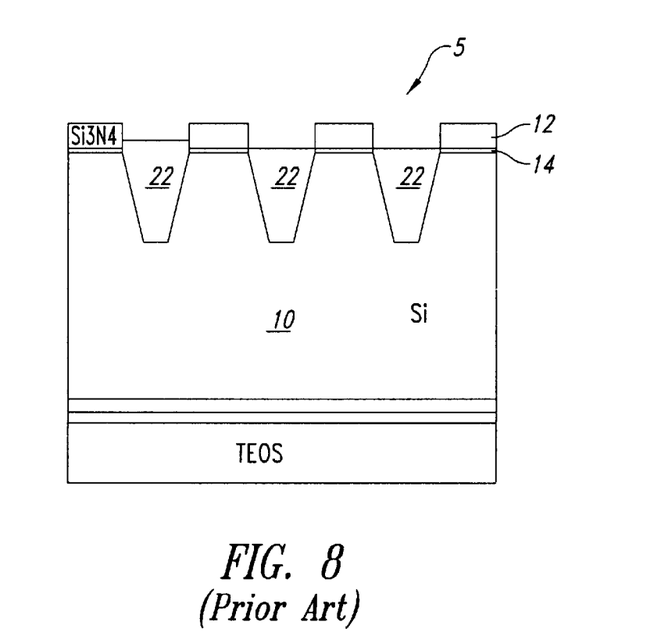
Figure 13:
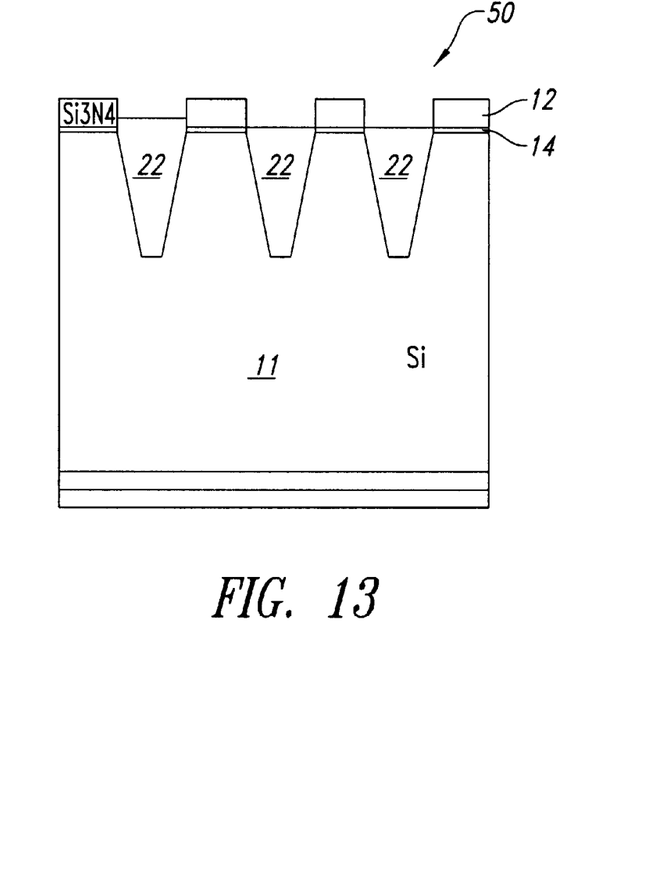

The wafer 50 in FIG. 13 appears as wafer 5 does in FIG. 8. However, it took many fewer steps using embodiments of the invention to progress from the way the wafer 50 appears in FIG. 11 to the way it appears in FIG. 13 than did the wafer 5 to progress from the way it appeared in FIG. 2 to the way it appears in FIG. 8. Specifically, as shown in FIG. 12, using the two portions of the HDPCVD deposition process, the wafer 50 can have its trenches 20 filled and the wafer partially planarized without any additional intermediary steps. Indeed, just by eliminating the necessity of the mask 28 of FIG. 5 of the prior art process, the following operations become no longer necessary: coating, exposure and lithographic development, post-development measurements of mask overlap and other critical dimensions, oxide etching and subsequent removals of the lithographic resin by plasma and in aqueous solution, and post-etch measurement of the critical dimensions. This elimination of steps can reduce both the development time and cost of producing integrated circuits.

Figure 14:
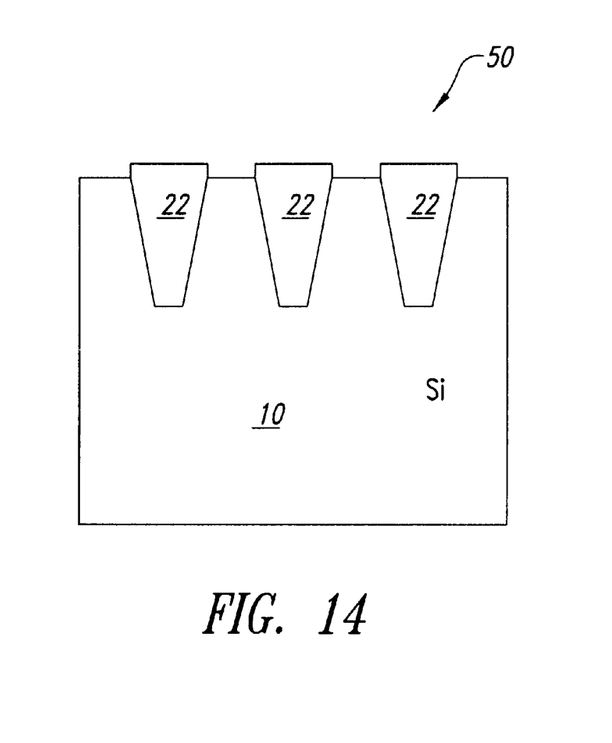

Following the CMP process performed on the wafer 50 as it appears in FIG. 13, the remaining nitride areas 12 and the optional PADOX layer 14 are removed from the wafer 50, leaving the completed STI structures as shown in FIG. 14. This figure corresponds to FIG. 10, which shows the wafer 5 at the same stage. Thus, with embodiments of the invention, it is possible to create STI structures with many fewer steps than those used by the prior art, and subsequently the cost to produce such a structure is likewise reduced.

Figure 15:
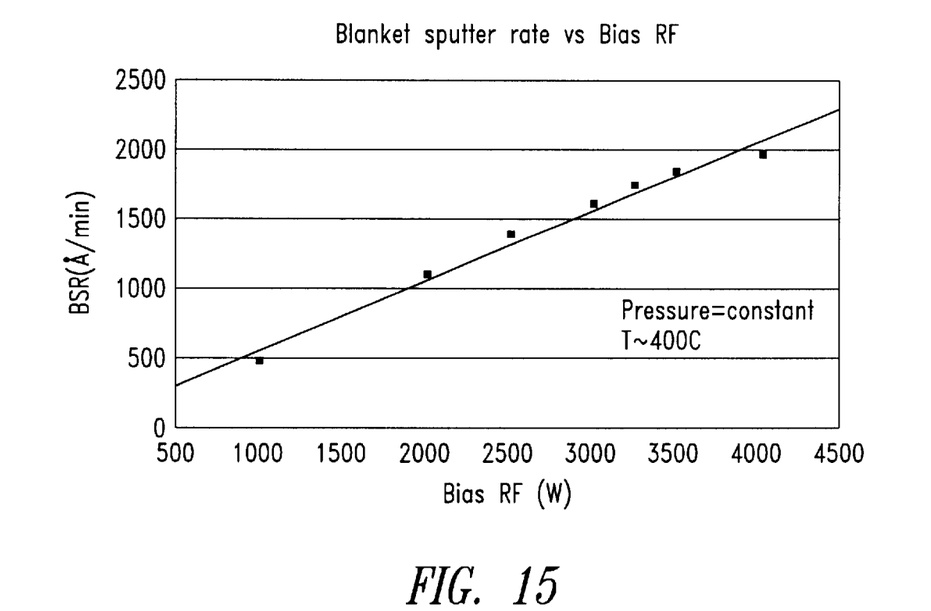
FIGS. 15–17 are graphs showing rates of deposition as different variables in deposition are changed.
Figure 16:
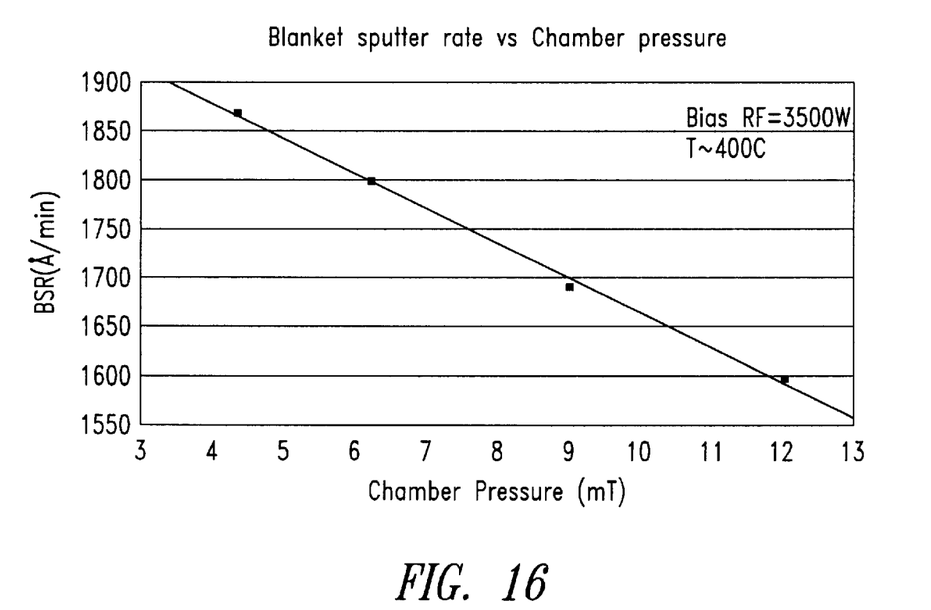
Figure 17:
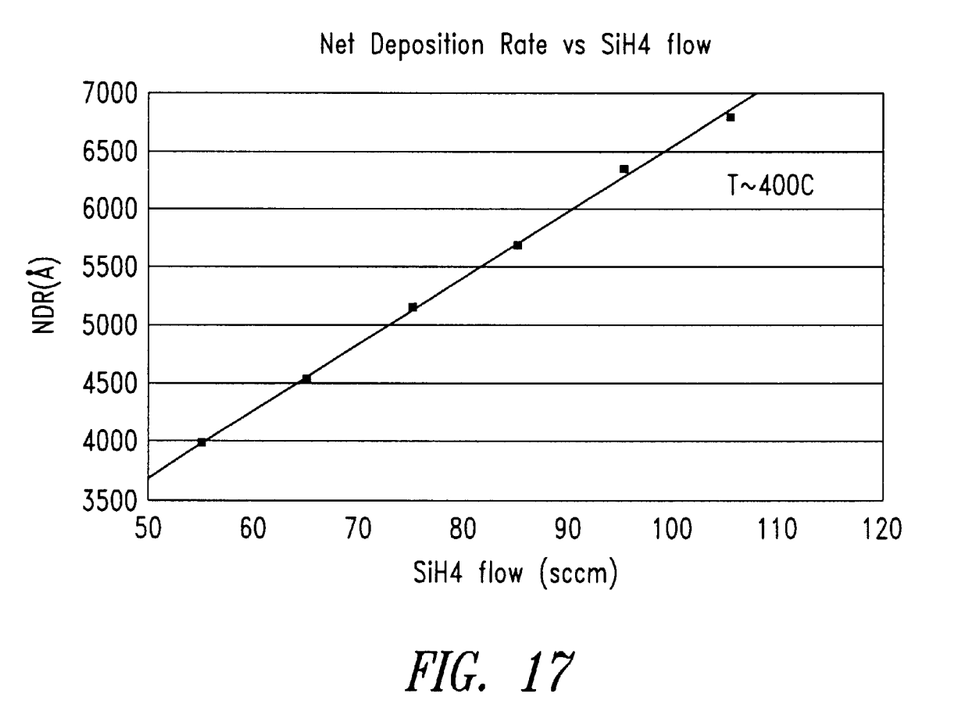

FIGS. 15 and 16 show how blanket sputter rates are affected by changes in Bias RF and chamber pressure, respectively. Generally, the blanket sputter rate increases with an increase in Bias RF (FIG. 15), while it decreases as the chamber pressure is increased (FIG. 16). A net deposition rate of a dielectric film charted against a rate of silane flow is shown in FIG. 17. As seen in that Figure, increased silane flow increases the net deposition rate, for a given constant temperature. These FIGS. 15–17 illustrate how a desired deposition to sputter ratio can be obtained by varying these few parameters in order to optimize the deposition of the first dielectric layer 62.

Temperature attained by the wafers during the process can be adjusted by using a helium (He) flow forced through pinholes provided in a plate to which the individual wafers are electrostatically held during the deposition process. When the HDPCVD technique is used for an intermetal dielectric, the optimum temperature attained by the wafers is 400° C., due to problems of integration to other processes involved in the fabrication of the devices. In contrast, in the shallow trench-filling deposition process described above, the temperatures can be much higher (above 700° C.), and this parameter also improves the composition of the deposited oxide, providing it with comparable characteristics to those of thermal oxides.

Figure 18:
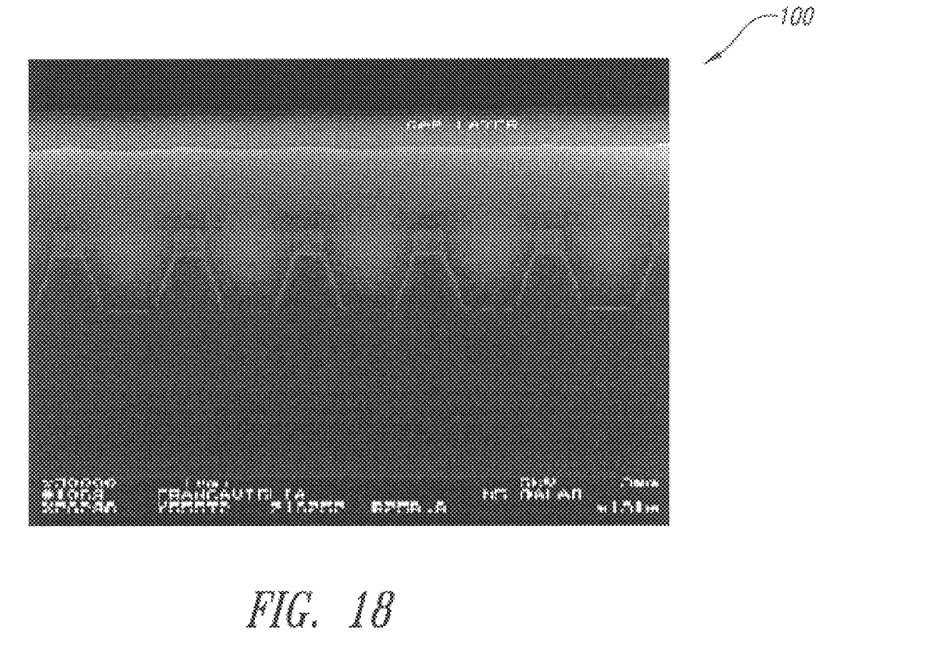
FIGS. 18–21 are photographs showing examples of shallow trench isolations formed according to embodiments of the invention.
Figure 19:
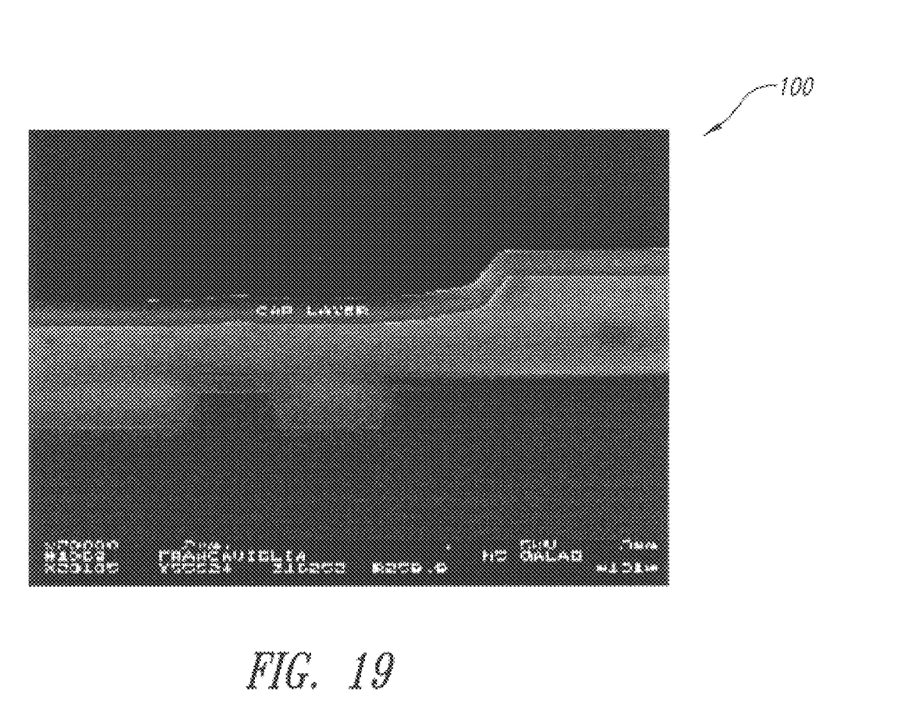
Figure 20:
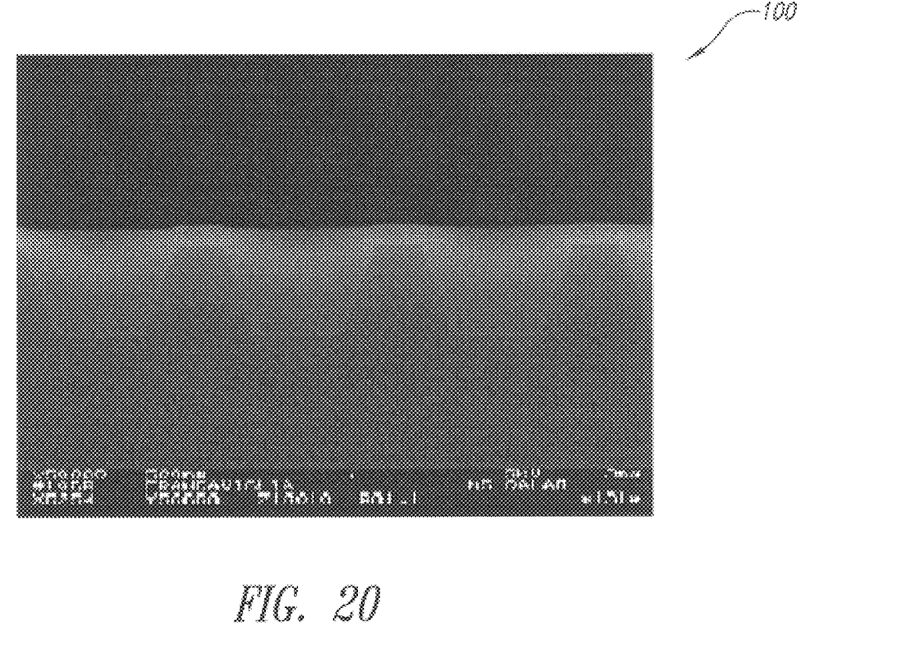
Figure 21:
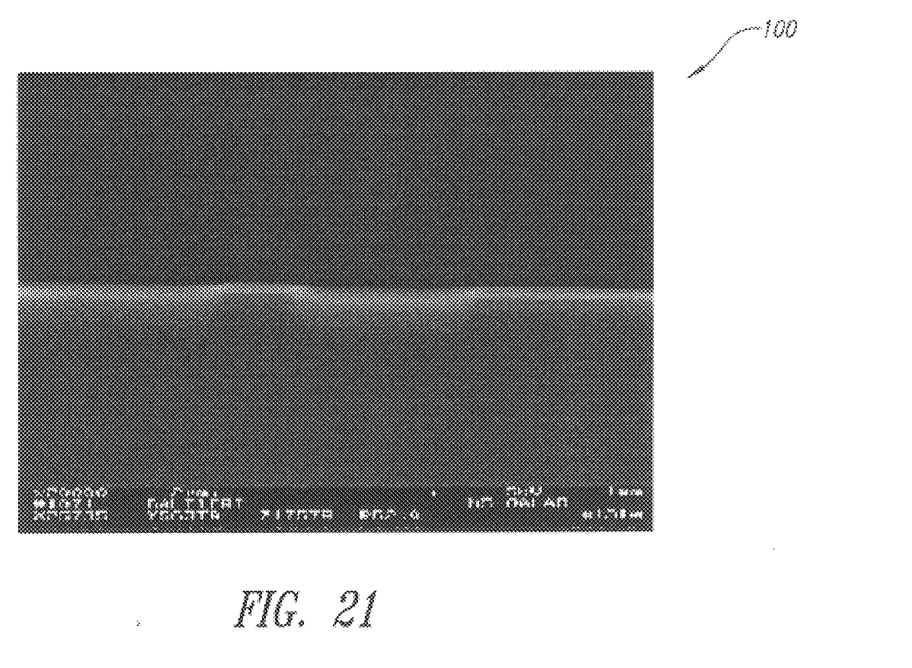

The end product of a dielectric layer that has been deposited by this two-step HDPCVD process should be a deposited film of such topology that it can be etched directly by a CMP technique. Shown in FIGS. 18–21 are photographs of actual productions of STI structures produced by this technique. FIG. 18 shows a profile of a single deposition of a silicon oxide by HDPCVD in a cell matrix of a memory chip 100. FIG. 19 similarly shows the same type of deposition at the edge of the matrix in the memory chip 100. FIG. 20 shows the same portion of the memory chip 100 as did FIG. 18, after it was polished by CMP. FIG. 21 shows the same portion of the memory chip 100 as did FIG. 19, after it was polished by CMP.

These films described above and shown in FIGS. 18–21 are the correct thicknesses to: 1) compensate for an effect of different CMP etch rates between device areas having more or less dense structures, 2) show none of the spikes that are typical of HDP processes, and 3) have height differences that never exceed 3500 Å. These features of the dielectric layer thus produced make unnecessary the use of the counter mask of the prior art to facilitate removal and planarization of the field oxide by CMP in the event of the film surface topology being particularly uneven, and also eliminate the need for the subsequent oxide etching in order to remove the mask.

In addition to the advantages accruing from the elimination of the counter mask steps, the use of a single self-planarizing oxide layer further simplifies the scheme for implementing shallow trench isolation. For instance, the densification step whereby the two dielectric layers are homogenized becomes unnecessary. Furthermore, because the TEOS layer 24 is no longer used, a further step of removing that layer from the back of the substrate becomes unnecessary as well. Finally, because no additional oxides need to be created, steps of creating an oxide by using a kiln also become unnecessary.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method to form isolation structures on a semiconductor substrate, comprising:
    forming a trench in the semiconductor substrate;
    depositing a first portion of a dielectric layer at a first rate by a High Density Plasma—Chemical Vapor Deposition into the trench and onto the semiconductor substrate to at least partially fill the trench;
    partially planarizing the dielectric layer by depositing a second portion of the dielectric layer at a second rate by the High Density Plasma—Chemical Vapor Deposition over the semiconductor substrate, without repeating the depositing of the first and second portions at the first and second rates, respectively; and
    directly removing a portion of the partially planarized dielectric layer deposited at the second rate, without performing intermediary processes after depositing the second portion of the dielectric layer.

2. The method of claim 1 wherein directly removing a portion of the partially planarized dielectric layer deposited at the second rate comprises polishing the dielectric layer down to a surface of the semiconductor substrate.

3. The method of claim 2, wherein polishing the dielectric layer comprises Chemical Mechanical Polishing.

4. The method of claim 1 wherein depositing a first portion of a dielectric layer at a first rate comprises using a silane/oxygen solution having a first flow rate.

5. The method of claim 4 wherein depositing a second portion of the dielectric layer comprises using a silane/oxygen solution having a second flow rate, the second flow rate being less than the first flow rate.

6. The method of claim 4 wherein depositing a second portion of the dielectric layer comprises using a silane/oxygen solution having a second flow rate, the second flow rate being about one-half of the first flow rate.

7. The method of claim 1 wherein depositing the first and second portions of the dielectric layer comprise depositing an oxide layer.

8. The method of claim 1 wherein the dielectric layer is deposited in an ambient temperature of about 700 degrees centigrade.

9. The method of claim 1 wherein the first portion of the dielectric layer is deposited until it completely fills the trench.

10. A method to form isolation structures on a silicon wafer, comprising:

forming a trench in the silicon wafer;

depositing by HDPCVD a first portion of an oxide layer at a first rate onto the silicon wafer and into the trench to at least partially fill the trench;

changing process parameters of the HDPCVD once;

partially planarizing the oxide layer by depositing by HDPCVD, using the changed process parameters, a second portion of the oxide layer at a second rate onto the silicon wafer, without repeating the depositing of the first and second portions at the first and second rates, respectively; and directly removing at least a portion of the partially planarized oxide layer deposited at the second rate, without performing intermediary processes after depositing the second portion of the oxide layer.

11. The method of claim 10 wherein directly removing at least a portion of the partially planarized oxide layer deposited at the second rate comprises polishing the oxide layer down to a surface of the silicon wafer.

12. The method of claim 11, wherein polishing the oxide layer comprises Chemical Mechanical Polishing.

13. The method of claim 10 wherein depositing a first portion of an oxide layer at a first rate comprises using a silane/oxygen solution having a first flow rate.

14. The method of claim 13 wherein changing process parameters of the HDPCVD comprises changing the first flow rate of the silane/oxygen solution to a second flow rate less than the first flow rate.

15. The method of claim 14 wherein the second flow rate is approximately one-half the first flow rate.

16. The method of claim 10 wherein the oxide layer is deposited in an ambient temperature of about 700 degrees centigrade.

17. The method of claim 10 wherein the first portion of the oxide layer is deposited until it completely fills the trench.

18. An isolation structure formed on a semiconductor wafer, formed by:

creating a trench in the semiconductor wafer;

depositing by HDPCVD a first portion of a dielectric layer at a first rate onto the semiconductor wafer and into the trench to at least partially fill the trench;

changing process parameters of the HDPCVD once;

partially planarizing the dielectric layer by depositing by HDPCVD, using the changed process parameters, a second portion of the dielectric layer at a second rate onto the semiconductor wafer, without repeating the depositing of the first and second portions at the first and second rates, respectively; and directly removing at least a portion of the partially planarized dielectric layer deposited at the second rate, without performing intermediary processes after depositing the second portion of the dielectric layer.

19. The isolation structure of claim 18 wherein the first portion of the dielectric layer completely fills the trench.

20. The isolation structure of claim 18 wherein the dielectric layer is a silicon oxide.

* * * * *